(12) United States Patent
Nakamoto

(10) Patent No.: US 6,324,666 B1
(45) Date of Patent: Nov. 27, 2001

(54) MEMORY TEST DEVICE AND METHOD CAPABLE OF ACHIEVING FAST MEMORY TEST WITHOUT INCREASING CHIP PIN NUMBER

(75) Inventor: Yukio Nakamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/220,366

(22) Filed: Dec. 24, 1998

(30) Foreign Application Priority Data

Apr. 20, 1998 (JP) .................................................. 10-109971

(51) Int. Cl.[7] ............................ G01R 31/28; G06F 11/00
(52) U.S. Cl. ........................ 714/736; 714/738; 714/719; 365/201
(58) Field of Search ............................... 714/718, 25, 719, 714/42, 710, 723, 734, 735, 736, 738, 739, 732, 35, 45, 711; 365/200–201, 189.02, 194; 711/220; 707/100–101

(56) References Cited

U.S. PATENT DOCUMENTS

| | | | |
|---|---|---|---|
| 4,460,997 | * | 7/1984 | Harns .................... 714/711 |
| 4,736,373 | * | 4/1988 | Schmidt ................ 714/711 |
| 5,748,543 | * | 5/1998 | Lee et al. .............. 365/200 |
| 5,838,694 | * | 11/1998 | Illes et al. ............. 714/738 |
| 5,928,373 | * | 7/1999 | Yoo ...................... 714/719 |
| 5,954,817 | * | 9/1999 | Janssen et al. ....... 713/200 |
| 5,991,902 | * | 11/1999 | Yoshida ................ 714/710 |
| 6,065,141 | * | 5/2000 | Kitagawa .............. 714/711 |
| 6,131,171 | * | 10/2000 | Whetsel ................ 714/35 |

FOREIGN PATENT DOCUMENTS

| | | | |
|---|---|---|---|
| 10-83695 | 3/1998 | (JP) | .............................. C25F/7/00 |
| 8-146098 | 6/1996 | (JP) | ........................... G01R/31/28 |
| 6-110724 | 4/1994 | (JP) | ............................ G06F/11/22 |

OTHER PUBLICATIONS

Lala, P.K et al. (On fault–tolerant PLA design; IEEE, 1990.).*
Dreibelbis, J et al. (An ASIC library granular DRAM macro with built–in self test; IEEE, 1998).*
Njinda, C.A. et al. (HIT: hierarchical integrated test methodology; IEEE, 1989).*
Chang, M.–F. et al. (Diagnosis and repair of memory with coupling faults; IEEE, Apr. 1989).*

* cited by examiner

Primary Examiner—Albert Decady
Assistant Examiner—Guy J. Lamarre
(74) Attorney, Agent, or Firm—Burns, Doane, Swecker & Mathis, LLP

(57) ABSTRACT

A memory test device that issues a test pattern read request to a memory, captures test pattern signals placed by the memory on a data input/output bus in response to the test pattern read request, and compares the test pattern signals with their expected values. This can solve a problem involved in a conventional memory test device in that because the pin width of data pins is narrower than the bus width of the data input/output bus that connects a memory and a data bus controller, even if the memory reads test pattern signals in accordance with the width of the data input/output bus, the test pattern signals cannot be sent to the tester without being divided, and hence the tester cannot achieve the quick test of the memory.

20 Claims, 6 Drawing Sheets

MEMORY TEST DEVICE AND METHOD CAPABLE OF ACHIEVING FAST MEMORY TEST WITHOUT INCREASING CHIP PIN NUMBER

BACKGROUND OF THE INVENTION

1. Field of the Invention

The present invention relates to a memory test device and memory test method for deciding the presence or absence of a defective bit of a memory.

2. Description of Related Art

FIG. 6 is a block diagram showing a conventional memory test device. In FIG. 6, the reference numeral 1 designates a chip that mounts a memory 19 to be tested; 2 designates a tester for testing a memory 19 embedded in the chip 1; 3 designates a pattern program storing memory 3 for storing a test pattern and the like; and 4 designates a pattern generator that when writing the test pattern in the memory 19, supplies control level generators 5 with a write request of the test pattern, and supplies address level generators 6 with write addresses of the test pattern, and when reading the test pattern, supplies the control level generators 5 with a read request of the test pattern, and supplies the address level generators 6 with the read addresses of the test pattern. The pattern generator 4 acquires, when producing the write request or read request of the test pattern, a data pattern from the pattern program storing memory 3, and supplies data level generating comparators 7 with the test pattern in accordance with the data pattern.

Each reference numeral 5 designates the control level generator that receives from the pattern generator 4 the write request or read request of the test pattern, and supplies it to one of control test pins 9; each reference numeral 6 designates the address level generator that receives from the pattern generator 4 the write address or read address of the test pattern, and supplies it to one of address test pins 10; and each reference numeral 7 designates the data level generating comparator that supplies, when receiving from the pattern generator 4 the test pattern to be written in the memory 19, one of the data test pins 11 with an H or L level signal corresponding to the test pattern (the H or L level signal corresponding to the test pattern will be called a "test pattern signal" from now on), and supplies, when receiving from the pattern generator 4 the test pattern which is expected to match the test pattern to be read from the memory 19, generates an expected value (H or L level value) corresponding to the test pattern, and compares the expected value with the signal level supplied from one of the data test pins 11.

The reference numeral 8 designate a total decision maker for deciding the presence or absence of a defective bit in the memory 19 in response to compared results supplied from individual data level generating comparators 7; 9 designates the control test pins connected to control pins 12 of the chip 1; 10 designates the address test pins connected to address pins 13 of the chip 1; 11 designates the data test pins of the tester 2, which are connected to data pins 14 of the chip 1; 12 designates the control pins of the chip 1, which are connected to the control test pins 9 of the tester 2; 13 designates the address pins of the chip 1, which are connected to the address test pins 10 of the tester 2, and 14 designates the data pins of the chip 1, which are connected to the data test pins 11 of the tester 2.

The reference numeral 15 designates a CPU of the chip 1; 16 designates a bus controller that supplies, when receiving from the tester 2 the write request or read request of the test pattern through the control test pins 9 and control pins 12, a memory 19 with the write request or read request, and that instructs an address controller 17 to supply the memory 19 with the write address or read address of the test pattern, and instructs a data bus controller 18 on the transfer direction of the test pattern; 17 designates the address controller that receives the write address or read address of the test pattern from the address pins 13 under the instructions of the bus controller 16, and supplies the memory 19 with the write address or read address; 18 designates the data bus controller for controlling the transfer direction of the test pattern under the instructions of the bus controller 16; and 19 designates the memory that when receiving from the bus controller 16 the write request of the test pattern, receives the test pattern signals from the data pins 14 through the data bus controller 18 and a data input/output bus 18b, and writes the test pattern signals to the write address fed from the address controller 17, and that when receiving from the bus controller 16 the read request of the test pattern, reads the test pattern signals stored in the read address fed from the address controller 17, and supplies the read test pattern signals to the data pins 14. Finally, the reference numeral 20 designates a test result pin.

Next, the operation of the conventional memory test device will be described.

First, the write process of the test pattern into the memory 19 will be described for making a decision as to whether a defective bit is present or not in the memory 19.

In this case, it is necessary for the pattern generator 4 to have the chip 1 recognize that the test pattern is to be written into the memory 19 from now on. Thus, the pattern generator 4 supplies the control level generators 5 with the write request of the test pattern, and the address level generators 6 with the write address of the test pattern.

In response to this, the control level generators 5 supply the bus controller 16 of the chip 1 with the write request of the test pattern through the control test pins 9 and control pins 12, and the address level generators 6 supply the address controller 17 of the chip 1 with the write address of the test pattern through the address test pins 10 and address pins 13. In the course of this, to supply the chip 1 with the test pattern to be written into the memory 19, the pattern generator 4 acquires the data pattern from the pattern program storing memory 3, and supplies the data level generating comparators 7 with the test pattern in accordance with the data pattern.

Receiving the test pattern from the pattern generator 4, the data level generating comparators 7 supply the data test pins 11 with the H or L level signals (test pattern signals) corresponding to the test pattern.

In this case, the data level generating comparators 7 are connected with the data test pins 11 in a one-to-one correspondence, and hence when the number of the data test pins 11 is 16, there are 16 data level generating comparators 7. Thus, the number of bits of the data is limited to 16 that can be transferred from the tester 2 to the chip 1 at a time. Accordingly, to write a 128-bit test pattern, for example, it must be divided into eight parts (128 bits/16 bits=8).

When the tester 2 supplies the chip 1 with the write request and write address of the test pattern, and the test pattern signals, the bus controller 16 supplies the memory 19 with the write request of the test pattern, and the address controller 17 provides the memory 19 with the write address of the test pattern.

In response to this, the memory 19 repetitively captures from the data pins 14 the test pattern signals eight times, and writes the test pattern signals into the write addresses.

After completing the write process of the test pattern into the memory 19, the test pattern is read from the memory 19 to decide whether the test pattern agrees with its expected values.

First, it is necessary for the pattern generator 4 to have the chip 1 recognize that the test pattern is to be read from the memory 19 from now on. Thus, the pattern generator 4 supplies the control level generators 5 with the read request of the test pattern, and the address level generators 6 with the read address of the test pattern.

In response to this, the control level generators 5 supply the bus controller 16 of the chip 1 with the read request of the test pattern through the control test pins 9 and control pins 12, and the address level generators 6 supply the address controller 17 of the chip 1 with the read address of the test pattern through the address test pins 10 and address pins 13. In the course of this, to make a decision whether the test pattern read from the memory 19 agrees with the expected values, the pattern generator 4 acquires the data pattern from the pattern program storing memory 3, and supplies the data level generating comparators 7 with the test pattern in accordance with the data pattern.

Receiving the test pattern from the pattern generator 4, the data level generating comparators 7 generate the expected values (H or L level signals) corresponding to the test pattern.

When the tester 2 provides the chip 1 with the read request and read address, the bus controller 16 supplies the memory 19 with the read request of the test pattern, and the address controller 17 supplies the memory 19 with the read address of the test pattern. Thus, the memory 19 reads the test pattern signals stored in the read address of the test pattern, and supplies the data pins 14 with the test pattern signals through the data input/output bus 18b and the data bus controller 18.

In this case, the data pins 14 are connected with the data test pins 11 in a one-to-one correspondence, and hence when the number of the data test pins 11 is 16, there are 16 data test pins 11. Thus, the number of bits of the data is limited to 16 that can be transferred from the chip 1 to the tester 2 at a time. Accordingly, to read a 128-bit test pattern, for example, it must be divided into eight parts (128 bits/16 bits=8).

Receiving the test pattern signals from the memory 19 in the chip 1 through the data test pins 11, the data level generating comparators 7 compare the test pattern signals with the corresponding expected values. This is repeated eight times when the test pattern consists of 128-bit data.

When the data level generating comparators 7 produce a result that the test pattern agrees with the expected values in the eight time comparing operations, the total decision maker 8 provides the test result pin 20 with a test result that no defective bit is present in the memory 19. On the contrary, when any one of the data level generating comparators 7 produces a result indicating that the test pattern does not entirely agree with the expected values in the eight time comparing operations, the total decision maker 8 provides the test result pin 20 with a test result that a defective bit is present in the memory 19.

Incidentally, Japanese patent application laid-open No. 6-110724/1994 discloses a technique that connects a test pattern generator to a decision maker for detecting a failure of a bus while it is not used in a system in which a CPU and a memory is connected to the bus.

The conventional memory test device with the foregoing configuration can make a decision as to whether a defective bit is present or not in the memory 19. The test device, however, cannot transfer the test pattern signals to the tester 2 unless the test pattern signals are divided into several parts because the data pins 14 has a pin width narrower than the bus width of the data input/output bus 18b connecting the memory 19 with the data bus controller 18, even if the memory 19 reads the test pattern signals in that bus width. This present a problem of being unable to achieve the test of the memory 19 quickly.

Although increasing the number of the pins of the chip 1 can relieve the pin width bottleneck of the data pins 14, it is difficult to do so because of the lack of a space for increasing the number of the pins of the chip 1.

Alternatively, it will be possible to speed up the test of the memory 19 by increasing the data rate between the tester 2 and chip 1. This, however, requires a more expensive tester and pins that can handle the higher rate data communications, and to reinforce countermeasures against noise between the pins of the tester 2 and chip 1.

SUMMARY OF THE INVENTION

The present invention is implemented to solve the foregoing problems. It is therefore an object of the present invention to provide a memory test device and memory test method capable of achieving the memory test without increasing the number of chip pins.

According to a first aspect of the present invention, there is provided a memory test device comprising: issue means for issuing test pattern associated data for designating a test pattern; expected value generating means for generating expected values of the test pattern designated by the test pattern associated data; memory control means for issuing a test pattern read request to a memory in response to the test pattern associated data; and comparing means for comparing the expected values with the test pattern which is read from the memory in response to the test pattern read request, and obtained by the comparing means through a data input/output bus.

Here, the issue means may comprise pattern number issue means for issuing a test pattern number as the test pattern associated data.

The issue means may comprise program issue means for issuing a data pattern as the test pattern associated data.

The memory test device may further comprise test pattern generating means for generating the test pattern designated by the test pattern number, and for supplying the data input/output bus with the test pattern generated by the test pattern generating means, wherein the memory control means may issue a test pattern write request to the memory in response to the test pattern number issued by the test number issue means.

The memory test device may further comprise test pattern generating means for generating the test pattern in accordance with the data pattern output from the program issue means, and for supplying the data input/output bus with the test pattern generated by the test pattern generating means, wherein the memory control means may issue a test pattern write request to the memory in response to the data pattern issued by the program issue means.

The memory test device may further comprise bus disconnection means for disconnecting the data input/output bus from an internal data bus, when the memory control means issues to the memory one of a read request and write request of the test pattern.

The memory test device may further comprise total decision means for producing a decision result that a defective bit is absent in the memory if comparing means outputs a positive result that the test pattern exactly agrees with the expected values, and for producing a decision result that a defective is present in the memory if the comparing means outputs a negative result that the test pattern disagrees with at least one of the expected values.

The memory test device may further comprise setting means for setting a test mode of the memory to carry out writing of the memory through the data input/output bus.

The memory test device may further comprise identification means for identifying a defective bit in the memory from compared results output from the comparing means.

The identification means may obtain an LT (laser trimming) remedial address from the defective bit of the memory.

The pattern number issue means may comprise a pattern number issue procedure memory, and issue the test pattern number using the pattern number issue procedure memory.

The memory test device may further comprise modification means for altering at least part of data pattern in the issue means and in the test pattern generating means.

According to a second aspect of the present invention, there is provided a memory test method comprising the steps of: issuing test pattern associated data for designating a test pattern; generating expected values of the test pattern designated by the test pattern associated data; issuing a test pattern read request to a memory in response to the test pattern associated data; and comparing the expected values with the test pattern which is read from the memory in response to the test pattern read request, and obtained through a data input/output bus.

Here, the step of issuing test pattern associated data may issue a test pattern number as the test pattern associated data.

The step of issuing test pattern associated data may issue a data pattern as the test pattern associated data.

The memory test method may further comprise the steps of: generating the test pattern designated by the test pattern number, and supplying the data input/output bus with the test pattern; and issuing a test pattern write request to the memory in response to the test pattern number.

The memory test method may further comprise the steps of: generating the test pattern in accordance with the data pattern, and supplying the data input/output bus with the test pattern; and issuing a test pattern write request to the memory in response to the data pattern.

The memory test method may further comprise the step of disconnecting the data input/output bus from an internal data bus, when one of a read request and write request of the test pattern is issued to the memory.

The memory test method may further comprise the step of identifying a defective bit of the memory from compared results of the test pattern with the expected values.

The memory test method may further comprise the step of obtaining an LT (laser trimming) remedial address from the defective bit of the memory.

DETAILED DESCRIPTION OF THE PREFERRED EMBODIMENTS

The invention will now be described with reference to the accompanying drawings.

EMBODIMENT 1

Figure 1:
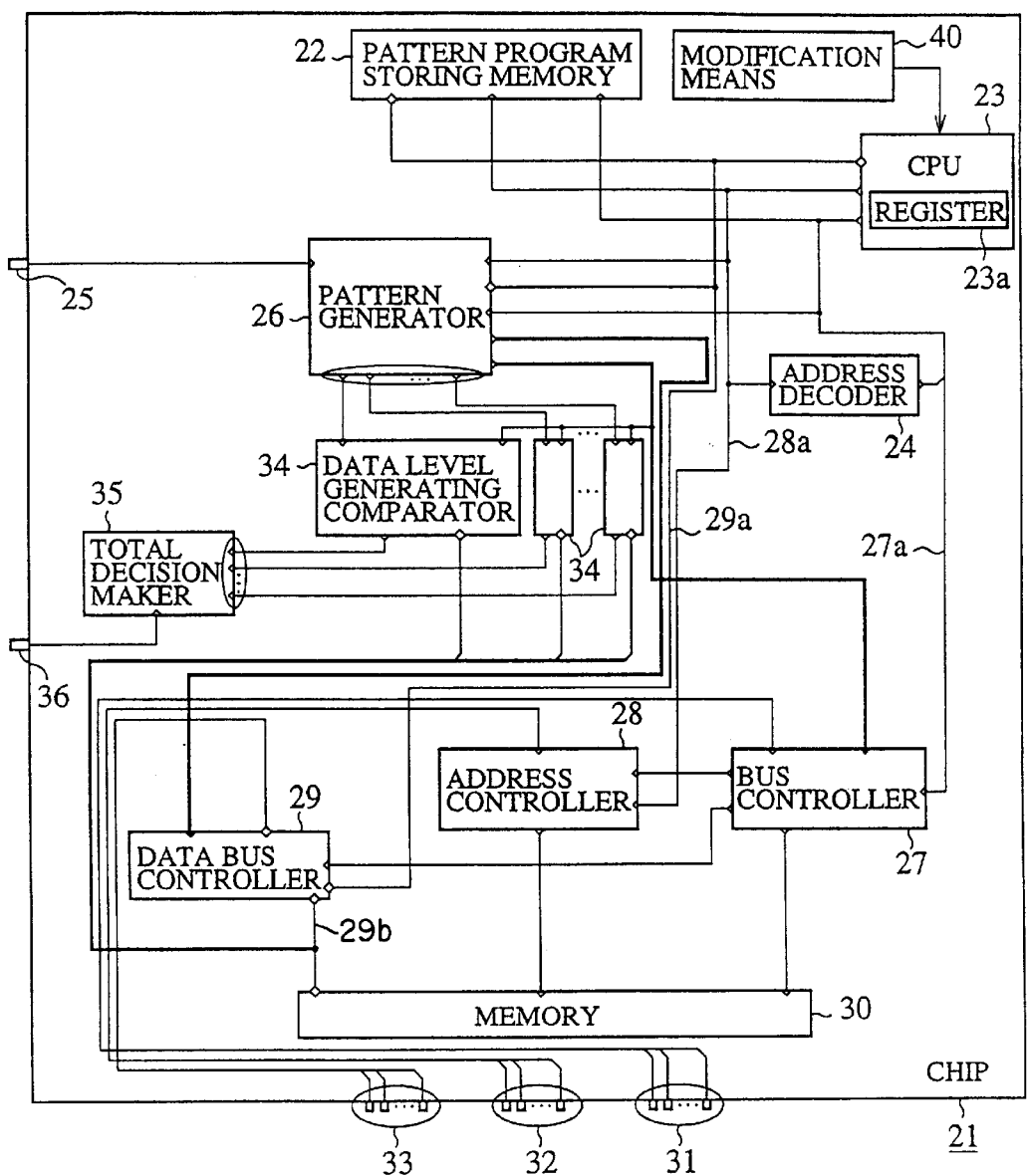
FIG. 1 is a block diagram showing a configuration of an embodiment 1 of a memory test device in accordance with the present invention.

FIG. 1 is a block diagram showing a configuration of an embodiment 1 of a memory test device in accordance with the present invention. In FIG. 1, the reference numeral 21 designates a chip that mounts a memory 30 to be tested; and 22 designates a pattern program storing memory (issue means, pattern number issue means, program issue means, and a pattern number issue procedure memory) that stores a pattern program, a write command including a test pattern number and the like. The pattern program stores process control instructions such as a jump command and a loop counter command, which control the flow of the memory test; stores an address increment/decrement command for controlling the write or read address of the test pattern, which is stored in a register 23a of a CPU 23, an issue command for issuing the write command including the test pattern number, and other instructions needed for the memory test.

The reference numeral 23 designates the CPU (issue means, pattern number issue means, and program issue means) that executes the process control instructions, address increment/decrement command and the like in accordance with the execution procedure described in the pattern program stored in the pattern program storing memory 22, and in particular that receives, when writing to or reading from the memory 30 the test pattern, the write command including the test pattern number from the pattern program storing memory 22 in accordance with the issue command of the pattern program, and issues the write command. The reference numeral 23a designates the register for storing a write address or read address (address information); and 24 designates an address decoder (memory control means) for detecting, when the CPU 23 issues the write command, from the write address or read address stored in the register 23a an entity to be accessed by the CPU 23.

The reference numeral 25 designates a memory test pin for inputting a test execution signal for instructing the memory test device to carry out the memory test; 26 designates a pattern generator (memory control means, bus disconnection means, test pattern generating means, and expected value generating means). The pattern generator 26, when receiving through the memory test pin 25 the test execution signal and from the address decoder 24 a notification that the CPU 23 selects the memory 30 as the target to be accessed, instructs a bus controller 27 to issue to the memory 30 a write command (test pattern write request) or a read command (test pattern read request), and instructs a data bus controller 29 to disconnect a data input/output bus 29b from an internal data bus 29a, and generates the test pattern in accordance with the data pattern corresponding to the test pattern number included in the write command.

The reference numeral 27 designates the bus controller (memory control means) for instructing an address controller 28 to supply the memory 30 with address information (write address or read address); 28 designates the address controller (memory control means) that receives the address information from an internal address bus 28a under the control of the bus controller 27, and supplies the address information to the memory 30; 29 designates the data bus controller (bus disconnection means) for disconnecting the data input/output bus 29b from the internal data bus 29a; 30 designates the memory that obtains, when receiving the write command from the bus controller 27, the test pattern signals from the data input/output bus 29b, and writes them to the write address supplied from the address controller 28, and reads, when receiving the read command from the bus controller 27, the test pattern signals stored in the read address supplied from the address controller 28, and supplies them to the data input/output bus 29b; 31 designates control pins; 32 designates address pins; and 33 designates data pins.

Each reference numeral 34 designates one of a plurality of data level generating comparators (test pattern generating means, expected pattern generating means, and comparing means) that supply, when the pattern generator 26 instructs the bus controller 27 to issue the write command, the memory 30 through the data input/output bus 29b with H or L level signals (test pattern signals) corresponding to the test pattern supplied from the pattern generator 26, and that generate, when the pattern generator 26 instructs the bus controller 27 to issue the read command, expected values (H or L level signals) corresponding to the test pattern supplied from the pattern generator 26, and compare the expected values with the test pattern signals obtained through the data input/output bus 29b.

The reference numeral 35 designates a total decision maker (total decision means) which supplies, when the entire data level generating comparators 34 indicate the agreement of the test pattern signals with the expected values, a total decision pin 36 with a decision result indicative that no defective bit is present in the memory 30, and which supplies, when any one of the data level generating comparators 34 indicates the disagreement between the test pattern signals and the expected values, the total decision pin 36 with a decision result indicative that a defective bit is present in the memory 30. The reference numeral 36 designates the total decision pin for outputting the decision result of the total decision maker 35; and 40 designates a modification means for modifying the data pattern stored in the internal memory of the pattern generator 26 or the pattern program stored in the pattern program storing memory 22. The modification means 40 will be described later in connection with an embodiment 3.

Next, the input and output of signals and data to or from the respective block of FIG. 1 will be described. The CPU 23 has three buses, an internal control bus 27a, internal address bus 28a and internal data bus 29a. Through these buses, the CPU 23 supplies the pattern program storing memory 22 with an internal pattern program control signal and internal pattern program address signal, and exchanges the internal pattern program data with the pattern program storing memory 22. The CPU 23 supplies the pattern generator 26 with an internal data pattern control signal and internal data pattern address signal, and exchanges with the pattern generator 26 the internal data pattern data. Furthermore, the CPU 23 supplies the bus controller 27 and address controller 28 with an internal bus control signal and internal address signal through the internal control bus 27a and internal address bus 28a, respectively, and exchanges internal data with the data bus controller 29 through the internal data bus 29a.

The address decoder 24 receives a decode address from the CPU 23 through the internal address bus 28a, and supplies through the internal control bus 27a a select address to the bus controller 27, to which an external bus control signal is also supplied through the control pins 31. In response to these input signals, the bus controller 27 supplies the address controller 28 with an address control signal, the data bus controller 29 with a data control signal, and the memory 30 with a memory control signal. The address controller 28 is supplied, besides the internal address signal and address control signal, an external address signal through the address pins 32, and supplies the memory 30 with a memory address signal in response to these input signals. The data bus controller 29, besides the exchange of the internal data and the reception of the data control signal, exchanges external data through the data pins 33, and exchanges memory data with the memory 30 using these inputs.

The pattern generator 26 is supplied, besides the signals from the CPU 23, with the memory test execution signal from the memory test pin 25. While the test execution signal is being supplied and the CPU 23 selects the memory 30 as an access target, the pattern generator 26 issues to a bus controller 27 a write request or read request of the test pattern, and then instructs the data bus controller 29 on the forced disconnection. The pattern generator 26 further supplies the data level generating comparators 34 with the test pattern, and with an operation mode signal, the information notifying of the write request and read request.

The data level generating comparator 34 supplies, when writing the test pattern, the memory 30 with the test pattern signals corresponding to the test pattern through the data input/output bus 29b, and captures, when reading the test pattern, the test pattern signals read from the memory 30 through the data input/output bus 29b. In addition, the data level generating comparators 34 supply the total decision maker 35 with compared results of the data. The total decision maker 35 produced through the total decision pin 36 the total decision result.

Figure 2:
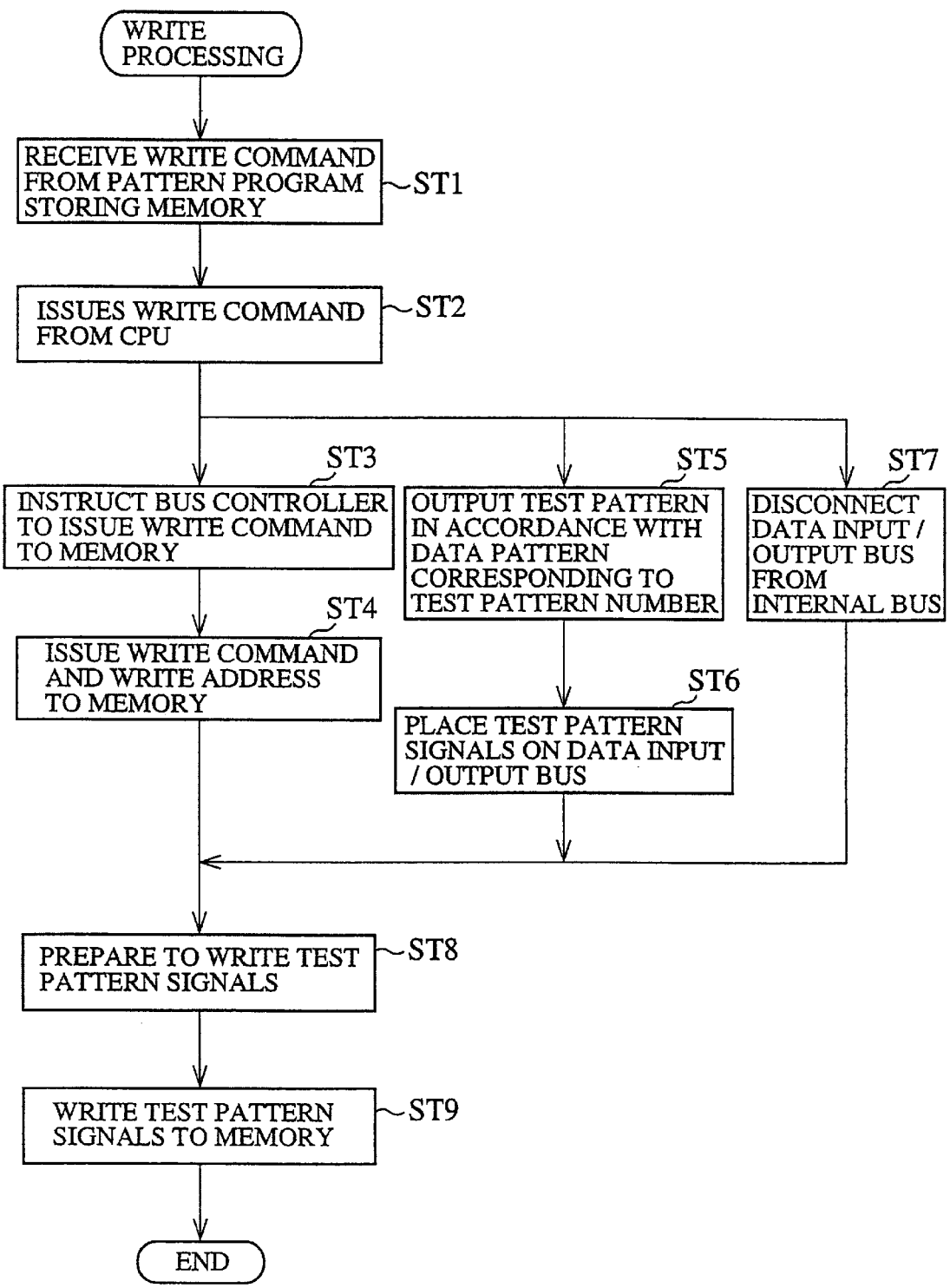
FIG. 2 is a flowchart illustrating the write process of a memory test method in accordance with the embodiment 1.
Figure 3:
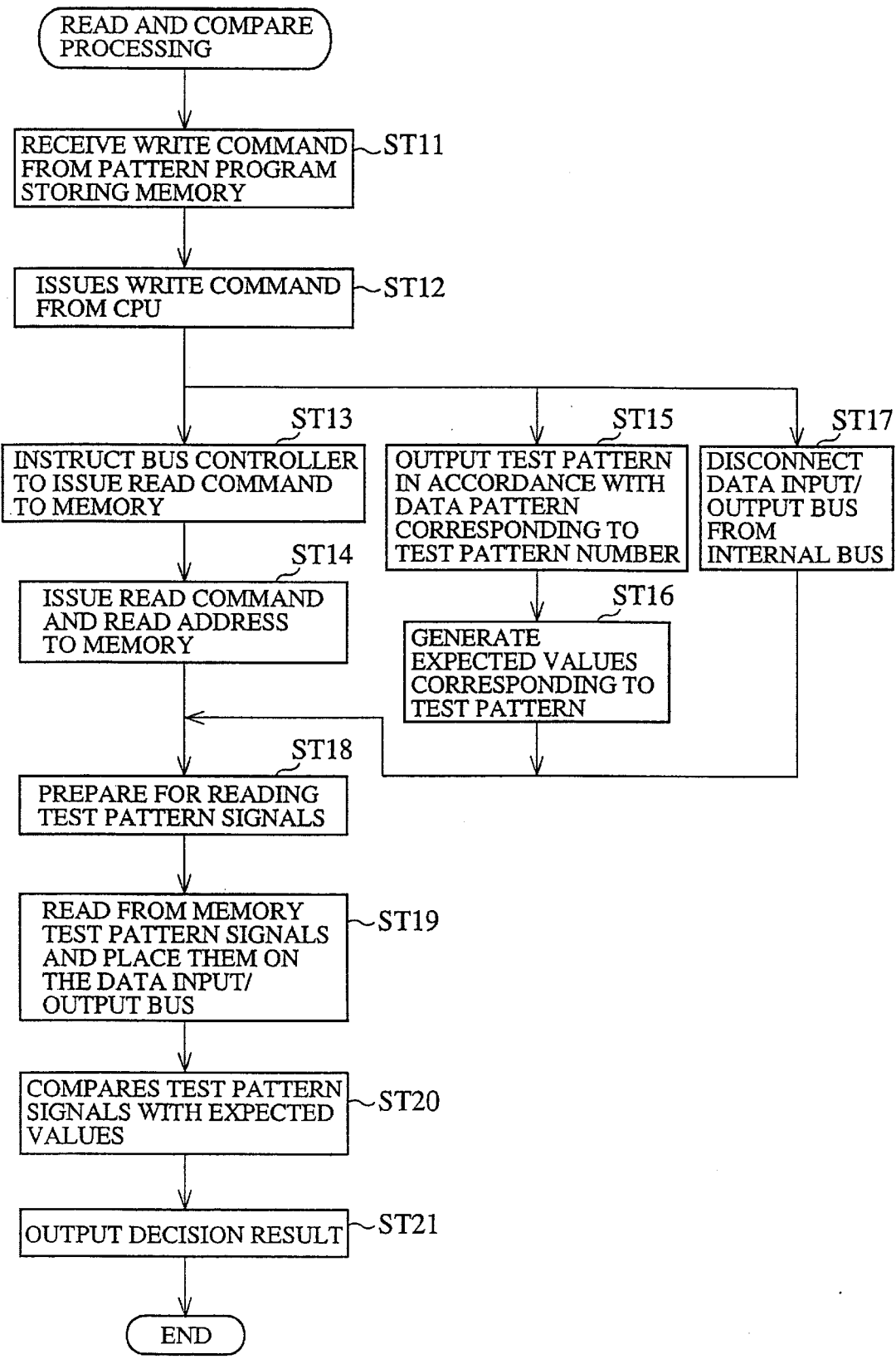
FIG. 3 is a flowchart illustrating the read process of the memory test method in accordance with the embodiment 1.

Next, the operation of the present embodiment 1 will be described with reference to FIGS. 2 and 3 illustrating the flow of the memory test method of the embodiment 1.

In the present embodiment 1, it is assumed that the chip 21 is operated by an internal clock signal which is generated by a PLL frequency multiplier not shown in FIG. 1 and has a frequency four times that of an external clock signal. In addition, it is assumed that the present embodiment 1 takes 12 internal clock pulse intervals, or three external clock pulse intervals, as a setup time needed for preparing writing or reading of the memory 30. Furthermore, it is assumed that the present embodiment 1 takes two internal clock pulse intervals, or half external clock pulse interval, as a time needed for executing writing or reading of the test pattern to or from the memory 30. Moreover, it is assumed that the number of pins of the data pins 33 is 16, identical to that of the conventional example in FIG. 6, and the bus width of the data input/output bus 29b is 128 bits.

First, to check whether any defective bit is present or not in the memory 30, the test pattern is written to the memory 30.

More specifically, in response to the issue command of the pattern program produced at a first pulse of the internal clock signal, or in the first quarter of a first external clock pulse interval, the CPU 23 receives from the pattern program storing memory 22 the write command including the test pattern number (step ST1), where Write command=Write [(write) test pattern number].

Having received the write command from the pattern program storing memory 22, the CPU 23 issues, at a second pulse of the internal clock signal, or in the second quarter of the first external clock pulse interval, the test pattern number in the write command to the internal data bus 29a, and issues to the internal address bus 28a the write address which is stored in the register 23a in response to the address increment/decrement command of the pattern program (step ST2).

In response to the write address issued to the internal address bus 28a by the CPU 23, the address decoder 24 detects that the CPU 23 selects the memory 30 as an access target, and notifies the pattern generator 26 of that.

Receiving the notification from the address decoder 24, the pattern generator 26 instructs, when the test execution signal is supplied from the memory test pin 25, the bus controller 27 to issue the write command (test pattern write request) to the memory 30 so that the memory 30 executes the write operation of the test pattern (step ST3).

Thus, the bus controller 27 issues the write command to the memory 30, and the address controller 28 issues to the memory 30 the test pattern write address the address controller 28 obtains through the internal address bus 28a under the control of the bus controller 27 (step ST4), thereby preparing the write operation of the memory 30. On the other hand, to supply the memory 30 with the test pattern signals to be written, the pattern generator 26 obtains from the internal data bus 29a the test pattern number output from the CPU 23, and supplies the data level generating comparators 34 with the test pattern in accordance with the data pattern corresponding to the test pattern number (step ST5). The data level generating comparators 34, which store in advance a plurality of data patterns in an internal memory not shown in FIG. 1, select the data pattern corresponding to the test pattern supplied through the internal data bus 29a.

The data level generating comparators 34 supply, when the pattern generator 26 instructs the bus controller 27 to issue the write command, the memory 30 through the data input/output bus 29b with the H or L level signals (test pattern signals) corresponding to the test pattern output from the pattern generator 26 (step ST6).

Here, the data level generating comparators 34 consists of 128 units, each of which is connected to one of the 128 bit data input/output bus 29b, so that the test pattern signals can be output in accordance with the width of the data input/output bus 29b. Therefore, the test pattern signals consisting of 128-bit data can be supplied to the memory 30 at a time.

Subsequently, the memory 30 prepares for writing the test pattern signals (step ST8) from the third pulse of the internal clock signal (third quarter of the first external clock pulse interval) to the 14th clock pulse of the internal clock signal (the second quarter of the fourth external clock pulse interval). In the course of this, the data bus controller 29 disconnects the data input/output bus 29b from the internal data bus 29a under the control of the pattern generator 26 at the third pulse of the internal clock signal (step ST7). This makes it possible to avoid the collision of the test pattern signals placed on the data input/output bus 29b with data placed on the internal data bus 29a by the CPU 23. Thus, the CPU 23 can start from that time to set up other operations such as a loop decision of a processing, setting of the next write address.

Completing the write preparation of the test pattern signals, the memory 30 executes at step ST9 the write operation of the test pattern signals supplied from the data input/output bus 29b from the 15th to 16th pulse of the internal clock signal (third to fourth quarter of the fourth external clock pulse interval).

Figure 6:
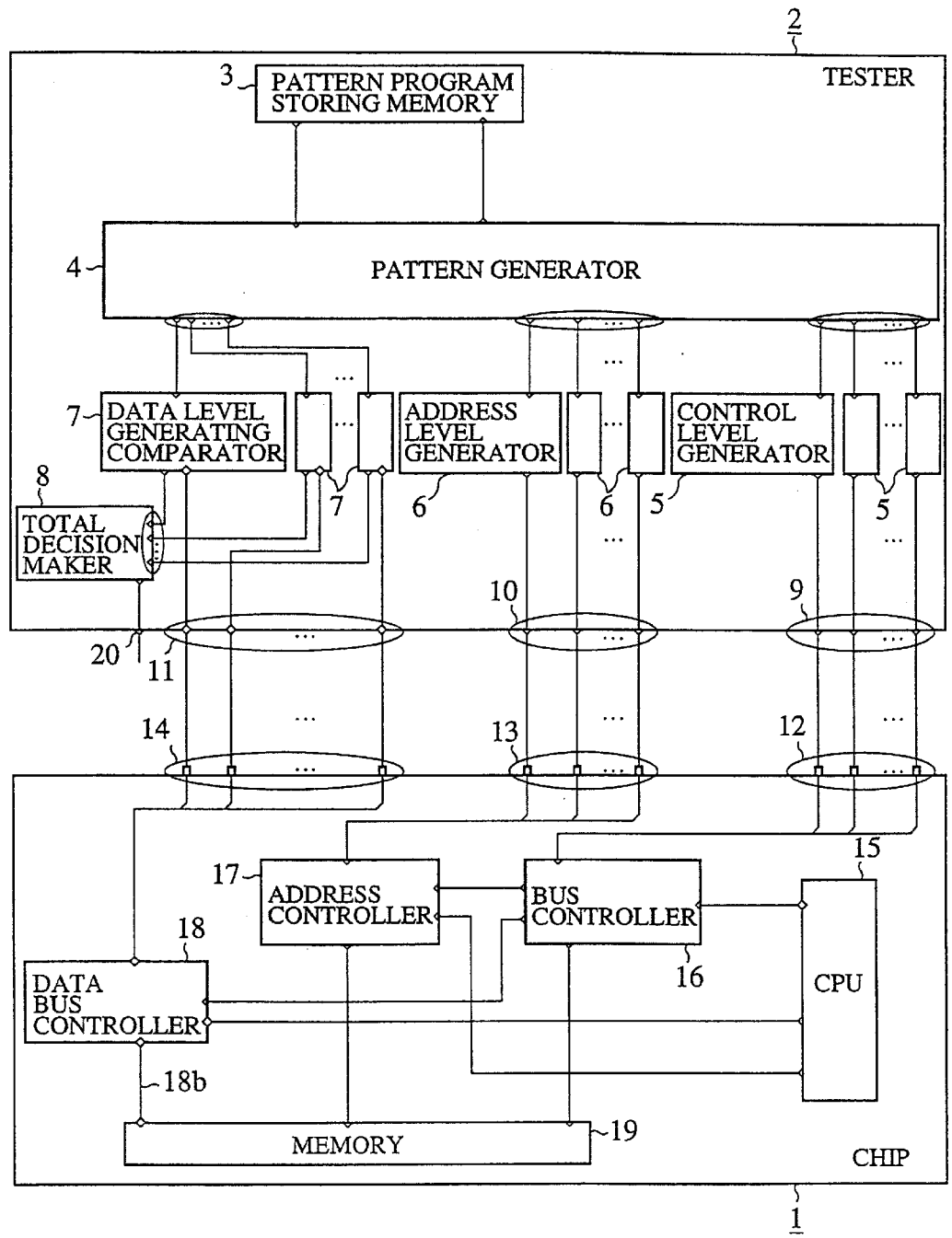
FIG. 6 is a block diagram showing a configuration of a conventional memory test device.

Incidentally, apart from the write preparation time, the conventional example as shown in FIG. 6 requires 32 internal clock pulse intervals, or eight external clock pulse intervals to write the 128-bit test pattern signals because the test pattern must be divided and delivered eight times.

This means that the total time necessary for completing the write operation of the test pattern beginning from the write request is given as follows: First, in the conventional example as shown in FIG. 6, the setup for the memory operation requires 12 internal clock pulse intervals (3 external clock pulse intervals), and the data write requires another 32 internal clock pulse intervals (eight external clock pulse intervals), totaling to 44 internal clock pulse intervals, or 11 external clock pulse intervals. In contrast with this, in the present embodiment 1, the entire write operation can be completed in 16 internal clock pulse intervals, or four external clock pulse intervals.

Furthermore, since the CPU 23 is disconnected from the data input/output bus 29b at the third internal clock pulse, the following 14 internal clock pulse intervals (three and half external clock pulse intervals) can be used for operations other than the write operation in the foregoing process.

Completing the write operation of the test pattern to the memory 30, the chip 21 reads the test pattern stored in the memory 30, and checks whether the test pattern agrees with the expected values or not.

More specifically, at a first pulse of the internal clock signal, or at the first quarter of a first external clock pulse interval, the CPU 23 receives from the pattern program storing memory 22 the write command including the test pattern number in accordance with the issue command of the pattern program (step ST11), where Write command=Write [(read) test pattern number].

Having received the write command from the pattern program storing memory 22, the CPU 23 issues, at the second pulse of the internal clock signal, or at the second quarter of the first external clock pulse interval, the test pattern number in the write command to the internal data bus 29a, and issues to the internal address bus 28a the read address that is stored in the register 23a in response to the address increment/decrement command of the pattern program (step ST12).

In response to the read address issued to the internal address bus 28a by the CPU 23, the address decoder 24 detects that the CPU 23 selects the memory 30 as the access target, and notifies the pattern generator 26 of that.

Receiving the notification from the address decoder 24, the pattern generator 26 instructs, if the test execution signal is supplied from the memory test pin 25, the bus controller 27 to issue the read command (test pattern read request) to the memory 30 so that the memory 30 executes the read operation of the test pattern (step ST13).

Thus, the bus controller 27 issues the read command to the memory 30, and the address controller 28 issues to the memory 30 the test pattern read address the address controller 28 obtains through the internal address bus 28a under the control of the bus controller 27 (step ST14), thereby preparing the read operation of the memory 30. On the other hand, to check whether the test pattern signals read from the memory 30 agree with the expected values, the pattern generator 26 obtains from the internal data bus 29athe test pattern number output from the CPU 23, and supplies the data level generating comparators 34 with the test pattern in accordance with the data pattern corresponding to the test pattern number (step ST15).

The data level generating comparators 34 generates, when the pattern generator 26 instructs the bus controller 27 to issue the read command, the expected values (H or L level values) corresponding to the test pattern supplied from the pattern generator 26 (step ST16).

Subsequently, the memory 30 prepares for reading the test pattern signals (step ST18) from the third pulse of the internal clock signal (third quarter of the first external clock pulse interval) to the 14th clock pulse of the internal clock signal (the second quarter of the fourth external clock pulse interval). In the course of this, the data bus controller 29 disconnects the data input/output bus 29b from the internal data bus 29a under the control of the pattern generator 26 at the third pulse of the internal clock signal (step ST17). This makes possible to avoid the collision of the test pattern signals placed on the data input/output bus 29b with data placed on the internal data bus 29a by the CPU 23. Thus, the CPU 23 can start from that time to set up other operations such as a loop decision of a processing, setting of the next write address.

Completing the read preparation of the test pattern signals, the memory 30 executes at step ST19 the read operation of the test pattern signals from the 15th to 16th internal clock pulse (third to fourth quarter of the fourth external clock pulse interval), and places the test pattern signals on the data input/output bus 29b.

Incidentally, apart from the setup time, the conventional example as shown in FIG. 6 requires 32 internal clock pulse intervals, or eight external clock pulse intervals to read the 128-bit test pattern signals because the test pattern must be divided and output eight times.

When the memory 30 places the test pattern signals on the data input/output bus 29b, the data level generating comparator 34 obtains the test pattern signals from the data input/output bus 29b, and compares the test pattern signals with the expected values at a time (step ST20).

If all the data level generating comparators 34 decide that the test pattern signals agree with the expected values, the total decision maker 35 supplies the total decision pin 36 with the check result that no defective bit is present in the memory 30. On the contrary, if any one of the data level generating comparators 34 makes a decision that the test pattern signal disagrees with the corresponding expected value, the total decision maker 35 supplies the total decision pin 36 with the check result that a defective bit is present in the memory 30 (step ST21).

Thus, the total time required for completing the read operation of the test pattern from the read request to the end of the comparison is given as follows: First, in the conventional example as shown in FIG. 6, the setup of the memory operation requires 12 internal clock pulse intervals (3 external clock pulse intervals), and the data read requires another 32 internal clock pulse intervals (eight external clock pulse intervals), totaling to 44 internal clock pulse intervals, or 11 external clock pulse intervals. In contrast with this, in the present embodiment 1, the entire read operation can be completed in 16 internal clock pulse intervals, or four external clock pulse intervals.

Furthermore, since the CPU 23 is disconnected from the data input/output bus 29b at the third internal clock pulse, the following 14 internal clock pulse intervals (three and half external clock pulse intervals) can be used for operations other than the read operation in the foregoing process.

As described above, the present embodiment 1 is configured such that when the memory 30 outputs and places the test pattern signals on the data input/output bus 29b in response to the test pattern read request, the data level generating comparators 34 capture the test pattern signals from the data input/output bus 29b and compares them with the expected values at a time. This offers an advantage of being able to accelerate the test of the memory 30 without increasing the number of pins of the chip 21.

EMBODIMENT 2

Although the CPU 23 issues the write command including the test pattern number in the foregoing embodiment 1, the CPU 23 can issue a write command including a data pattern, achieving an effect similar to that of the foregoing embodiment 1.

More specifically, the pattern program storing memory 22 stores the write command including the data pattern, and the CPU 23 issues the write command including the data pattern. The pattern generator 26, without having the internal memory for storing the data pattern, outputs the test pattern in accordance with the data pattern supplied from the CPU 23.

Although the time period the CPU 23 occupies the data input/output bus 29b becomes a little longer than that in the foregoing embodiment 1 because the amount of data of the write command including the data pattern is greater than that of the write command including the test pattern number, the internal memory of the pattern generator 26 can be removed, and the selection becomes unnecessary of the data pattern corresponding to the test pattern number.

EMBODIMENT 3

Although the foregoing embodiments 1 and 2 do not modify the data patterns stored in the internal memory of the pattern generator 26 or the pattern program stored in the pattern program storing memory 22, the modification means 40 can be provided for modifying the data patterns or the pattern program (see, FIG. 1).

This makes it easier to generate a variety of test patterns, offering an advantage of being able to implement various types of memory tests.

In addition, storing all of or part of the pattern program storing memory 22 in a ROM or flash memory makes it possible to implement a test during power-up after mounting the chip on a real product.

EMBODIMENT 4

Although the foregoing embodiments 1 and 2 generate the test pattern in accordance with a set of the pattern program, test patterns can be generated in accordance with a plurality of sets of the pattern programs, offering advantages similar to those of the foregoing embodiments 1 and 2.

EMBODIMENT 5

Figure 4:
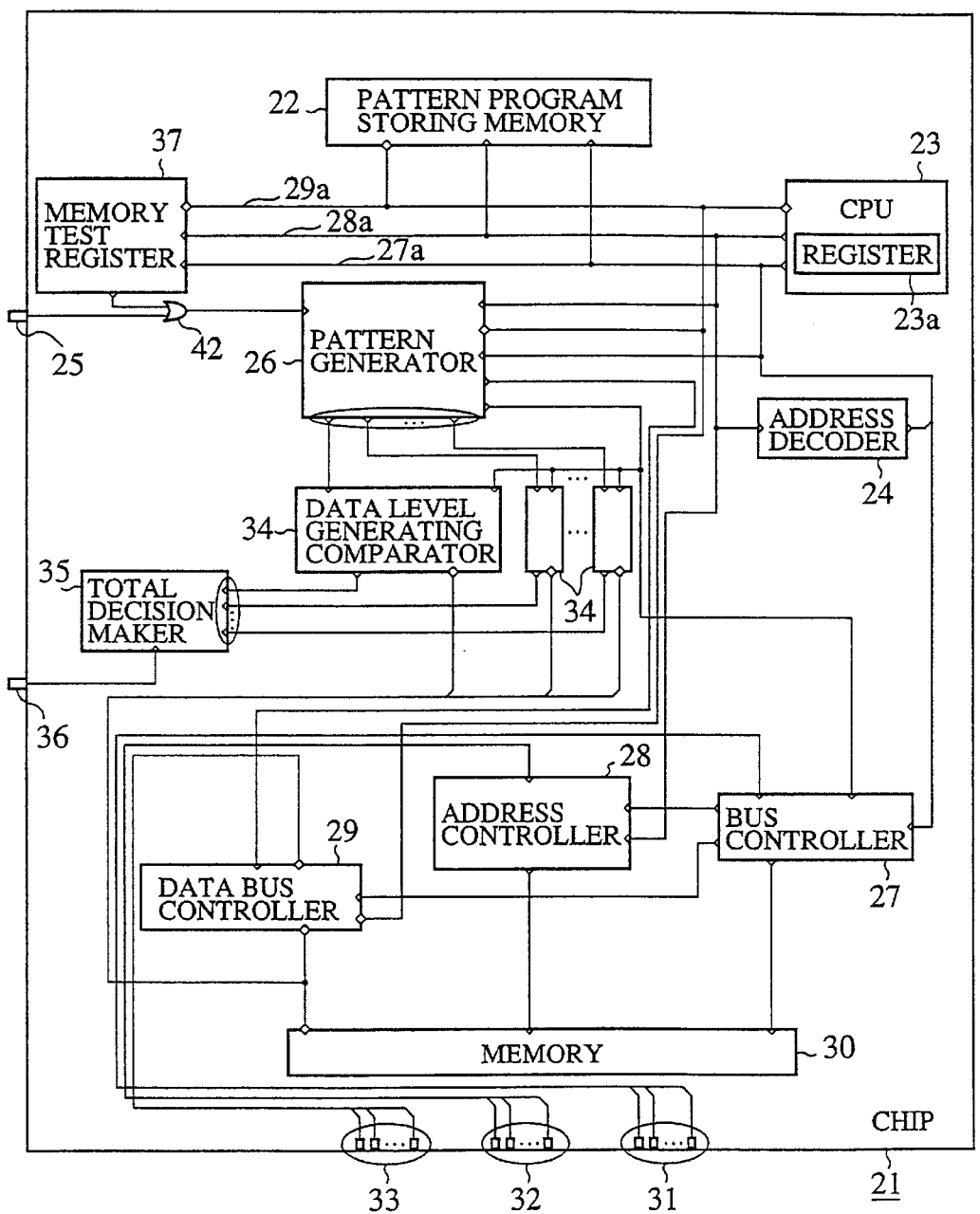
FIG. 4 is a block diagram showing a configuration of an embodiment 5 of the memory test device in accordance with the present invention.

FIG. 4 is a block diagram showing an embodiment 5 of the memory test device in accordance with the present invention, in which the same reference numerals designate the same or corresponding portions to those of FIG. 1, and the description thereof is omitted here.

In FIG. 4, the reference numeral 37 designates a memory test register (setting means) for setting a test mode of the memory. The memory test register 37 is provided for setting the memory test mode within the chip 21. More specifically, the CPU 23 exchanges information with the memory test register 37 through the internal buses 27a, 28a and 29a, and sets, in accordance with the pattern program, the memory test register 37 in the memory test mode. The output of the memory test register 37 is supplied to an OR circuit 42 in conjunction with the input to the memory test pin 25, and the OR circuit 42 supplies the pattern generator 26 with a memory test signal.

Next, the operation of the present embodiment 5 will be described.

To clear a work area of the memory 30, for example, the CPU 23 writes the same contents into the memory 30 iteratively. In this case, the number of bits the CPU 23 can write at a time is usually determined by the bus width of the internal data bus 29a because the bus width of the internal data bus 29a is generally designed in accordance with the amount of data the CPU 23 can handle at a time.

The width of the internal data bus 29a, however, is usually narrower than that of the data input/output bus 29b, and hence the internal data bus 29a causes a bottleneck in transferring the write data, making a quick write operation difficult.

In view of this, the present embodiment 5 supplies, when clearing the work area of the memory 30 or performing like operations, the write data from the data level generating comparators 34 to the memory 30 via the data input/output bus 29b without using the internal data bus 29a as in the memory test.

More specifically, the memory test register 37 causes the CPU 23 to recognize that processings to be executed from now on do not belong to a normal program mode but to a memory test mode.

This enables the CPU 23 to execute the processings as in the foregoing embodiment 1. Thus, the CPU 23 can clear the work area of the memory 30 by selecting the data pattern that provides test pattern signals of the same level (H level, for example).

When the internal data bus 29a has a 32-bit bus width and the data input/output bus 29b has a 128-bit bus width, for example, the 128-bit data can be written into the memory 30 at a time, although writing the same data via the internal data bus 29a in the normal mode requires the CPU 23 to iterate the write operation four times.

This requires the total of 28 internal clock pulse intervals: two internal clock pulse intervals for issuing the first write command; 12 internal clock pulse intervals for preparing write operation of the memory 30; two internal clock pulse intervals for the first write operation; 2×3 internal clock pulse intervals for issuing the second to fourth write commands; and 2×3 internal clock pulse intervals for the second to fourth write operations.

In contrast with this, in the present embodiment 5 applying the memory test mode, the data write can be achieved in 16 internal clock pulse intervals as described in the foregoing embodiment 1. Thus, using the memory test mode can nearly double the data write rate.

Incidentally, the test execution signal, which is input through the memory test pin 25 to instruct the implementation of the memory test, is supplied to the pattern generator 26 but not to the CPU 23 in the foregoing embodiment 1. Thus, the CPU 23 cannot recognize the test mode, and hence cannot carry out a processing such as clearing the work area of the memory 30 without using the internal data bus 29a as in the present embodiment 5. However, providing such wiring that supplies the test execution signal from the memory test pin 25 to the CPU 23 makes it possible to achieve a processing similar to that of the present embodiment 5.

As described above, the present embodiment 5 is configured such that it comprises the memory test register 37 for setting the memory test mode. This offers an advantage of being able to achieve the processing such as clearing the work area of the memory 30 quickly.

The memory test register 37 also offers an advantage of enabling the CPU 23 to carry out "Logic Test" and "Memory test" integrally.

More specifically, although the "Logic test" and "Memory test" are carried out separately using respective testers in a conventional memory embedded CPU, the two tests can be carried out using a tester for the "Logic test" in the present embodiment 5. This is because the present embodiment 5 can integrate the data pattern for the memory test into codes of the CPU 23 which are used in the "Logic Test".

EMBODIMENT 6

Figure 5:
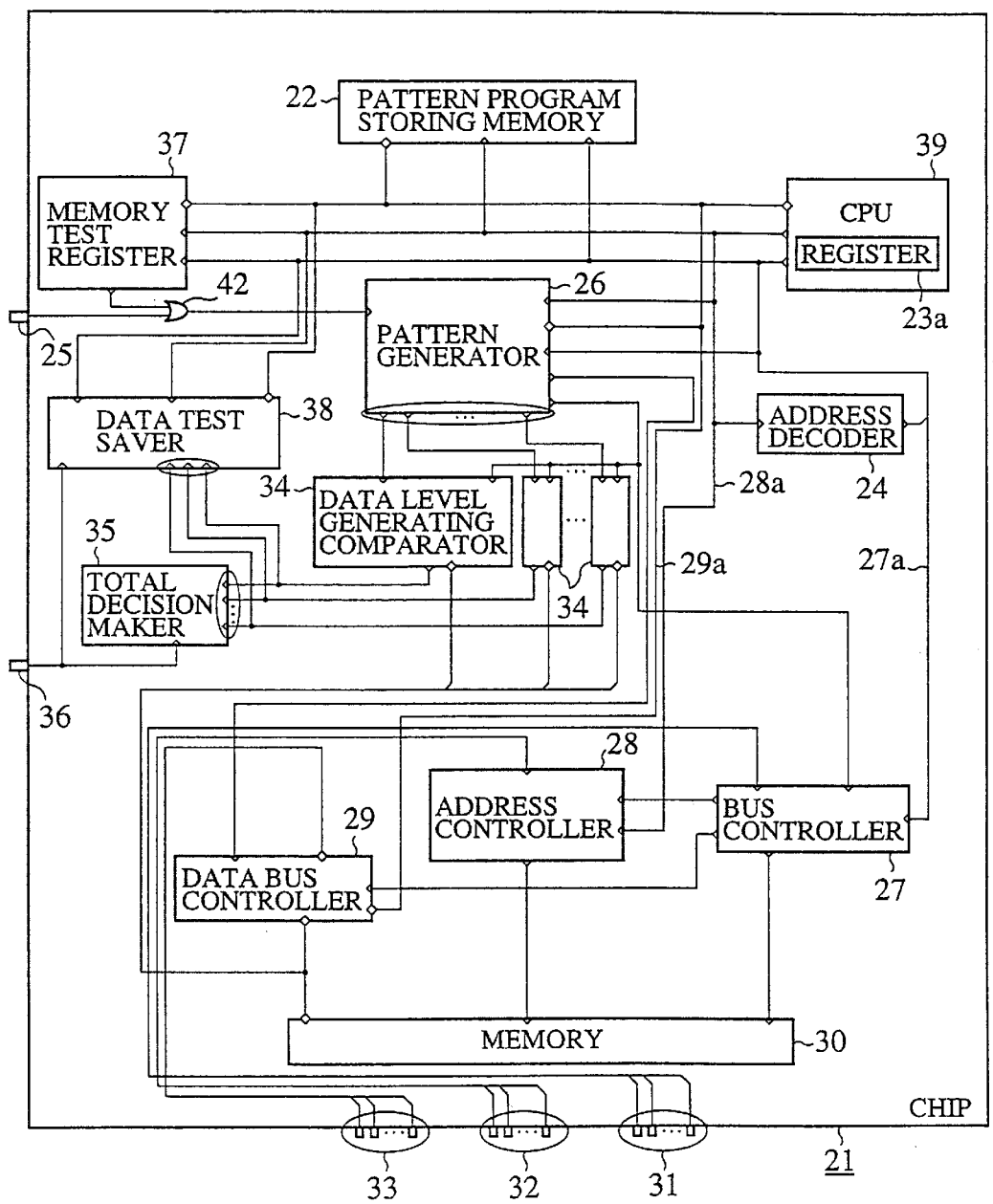
FIG. 5 is a block diagram showing a configuration of an embodiment 6 of the memory test device in accordance with the present invention.

FIG. 5 is a block diagram showing a configuration of an embodiment 6 of a memory test device in accordance with the present invention, in which the same reference numerals designate the same or corresponding portions to those of FIG. 4, and hence the description thereof is omitted here.

In FIG. 5, the reference numeral 38 designates a data test result saver (identification means) for storing the compared results output from the entire data level generating comparators 34; and 39 designates a CPU (pattern number issue means, and identifying means) that in addition to the functions similar to those of the CPU 23, identifies a defective bit or bits of the memory 30 from the compared results output from the entire data level generating comparators 34, and obtains an LT (laser trimming) remedial address from the defective bit of the memory 30. The data test result saver 38 stores the compared results output from all the data level generating comparator 34, receives from the CPU 39 a control signal and an address signal through the internal control bus 27a and internal address bus 28a, respectively, supplies the CPU 39 with the compared results output from the entire data level generating comparator 34.

Next, the operation of the present embodiment 5 will be described.

The memory 30 comprises spare row lines and spare column lines. If the memory 30 includes a defective bit due to some cause, the row line and column line connected with the defective bit cannot be used.

The physical location of the unusable row line and column line is called a remedial address. If the remedial address is detected, these row line and column line are disconnected, and are replaced with a spare row line and spare column line so that the defective bit is removed from the memory 30. This process is called a laser trimming process, or LT process.

An LT program is prepared for obtaining an optimum remedial address from the defective bit in the LT process.

Although the presence or absence of the defective bit can be checked in the foregoing embodiments 1–5, the defective bit cannot be identified. In view of this, in the present embodiment 6, the data test result saver 38 stores the compared results supplied from the entire data level generating comparators 34, and the CPU 39 identifies the defective bit of the memory 30 from the compared results.

After identifying the defective bit of the memory 30, the CPU 39 executes the LT program to obtain the LT remedial address from the defective bit.

As described above, the present embodiment 6 is configured such that it identifies the defective bit of the memory 30 from the compared results of the entire data level generating comparators 34, and obtains the LT remedial address from the defective bit. This offers an advantage of being able to implement the laser trimming process for removing the detective bit from the memory 30.

What is claimed is:

1. A memory test device comprising:
   issue means for issuing test pattern associated data for designating a test pattern;
   expected value generating means for generating expected values of said test pattern designated by said test pattern associated data;
   memory control means for issuing a test pattern read request to a memory in response to the test pattern associated data; and comparing means for comparing said expected values with said test pattern which is read from said memory in response to the test pattern read request, and obtained by said comparing means through a data input/output bus.

2. The memory test device as claimed in claim 1, wherein said issue means comprises pattern number issue means for issuing a test pattern number as the test pattern associated data.

3. The memory test device as claimed in claim 2, further comprising test pattern generating means for generating said test pattern designated by said test pattern number, and for supplying the data input/output bus with said test pattern generated by said test pattern generating means, wherein said memory control means issues a test pattern write request to said memory in response to said test pattern number issued by said test number issue means.

4. The memory test device as claimed in claim 2, wherein said pattern number issue means comprises a pattern number issue procedure memory, and issues said test pattern number using said pattern number issue procedure memory.

5. The memory test device as claimed in claim 1, wherein said issue means comprises program issue means for issuing a data pattern as the test pattern associated data.

6. The memory test device as claimed in claim 5, further comprising test pattern generating means for generating said test pattern in accordance with the data pattern output from said program issue means, and for supplying the data input/output bus with said test pattern generated by said test pattern generating means, wherein said memory control means issues a test pattern write request to said memory in response to the data pattern issued by said program issue means.

7. The memory test device as claimed in claim 1, further comprising bus disconnection means for disconnecting said data input/output bus from an internal data bus, when said memory control means issues to said memory one of a read request and write request of said test pattern.

8. The memory test device as claimed in claim 1, further comprising total decision means for producing a decision result that a defective bit is absent in said memory if comparing means outputs a positive result that said test pattern exactly agrees with said expected values, and for producing a decision result that a defective is present in said memory if said comparing means outputs a negative result that said test pattern disagrees with at least one of said expected values.

9. The memory test device as claimed in claim 1, further comprising setting means for setting a test mode of said memory to carry out writing of said memory through said data input/output bus.

10. The memory test device as claimed in claim 1, further comprising identification means for identifying a defective bit in said memory from compared results output from said comparing means.

11. The memory test device as claimed in claim 1, wherein said identification means obtains an LT (laser trimming) remedial address from the defective bit of said memory.

12. The memory test device as claimed in claim 1, further comprising modification means for altering at least part of data pattern in said issue means and in said test pattern generating means.

13. A memory test method comprising the steps of:
issuing test pattern associated data for designating a test pattern;
generating expected values of said test pattern designated by said test pattern associated data;
issuing a test pattern read request to a memory in response to the test pattern associated data; and
comparing said expected values with said test pattern which is read from said memory in response to the test pattern read request, and obtained through a data input/output bus.

14. The memory test method as claimed in claim 13, wherein the step of issuing test pattern associated data issues a test pattern number as the test pattern associated data.

15. The memory test method as claimed in claim 14, further comprising the steps of:
generating said test pattern designated by said test pattern number, and supplying the data input/output bus with said test pattern; and
issuing a test pattern write request to said memory in response to said test pattern number.

16. The memory test method as claimed in claim 13, wherein the step of issuing test pattern associated data issues a data pattern as the test pattern associated data.

17. The memory test method as claimed in claim 16, further comprising the steps of:
generating said test pattern in accordance with the data pattern, and supplying the data input/output bus with said test pattern; and
issuing a test pattern write request to said memory in response to the data pattern.

18. The memory test method as claimed in claim 13, further comprising the step of disconnecting said data input/output bus from an internal data bus, when one of a read request and write request of said test pattern is issued to said memory.

19. The memory test method as claimed in claim 13, further comprising the step of identifying a defective bit of said memory from compared results of said test pattern with said expected values.

20. The memory test method as claimed in claim 19, further comprising the step of obtaining an LT (laser trimming) remedial address from the defective bit of said memory.

* * * * *